(12) United States Patent
Daniel et al.

(10) Patent No.: US 6,875,553 B2
(45) Date of Patent: Apr. 5, 2005

(54) METHOD OF CASTING PHOTORESIST ONTO SUBSTRATES

(75) Inventors: Jurgen H. Daniel, Mountain View, CA (US); Alexandra Rodkin, San Francisco, CA (US)

(73) Assignee: Xerox Corporation, Stamford, CT (US)

( * ) Notice: Subject to any disclaimer, the term of this patent is extended or adjusted under 35 U.S.C. 154(b) by 77 days.

(21) Appl. No.: 10/323,142

(22) Filed: Dec. 18, 2002

(65) Prior Publication Data

US 2004/0121258 A1 Jun. 24, 2004

(51) Int. Cl.[7] ............................. G03F 7/004; B05D 3/00
(52) U.S. Cl. .................... 430/270.1; 430/325; 430/326; 427/133; 427/300; 427/358; 427/369; 427/370; 427/384; 264/331.15; 264/331.18; 264/337; 264/338
(58) Field of Search ............................. 430/270.1, 325, 430/326; 427/133, 300, 358, 369, 370, 384; 264/337, 338, 331.15, 331.18

(56) References Cited

U.S. PATENT DOCUMENTS 5,985,067 A * 11/1999 Schmid et al. ............ 156/89.16
6,191,053 B1    2/2001 Chun et al. ................. 438/780
6,509,085 B1 *  1/2003 Kennedy .................... 428/188

OTHER PUBLICATIONS

"Polydimethysiloxane, a photocurable rubberelastic polymer used as spring material in micromechanical sensors" by J.C. Lotters, W. Olthuis, P.H. Veltink, P. Bergveld, *Microsystem Technologies* (1997) 64–67, Springer–Verlag 1997.

"MEMS Materials and Fabrication Technology on Large Areas: The Example of an X–ray Imager" by J.H. Daniel, and others, *Mat. Res. Soc. Symp.*, vol. 657 ©2001 Materials Research Society.

"SU–8 photoepoxy: A new material for FPD or PDP applications" by L.J. Guerin, C.W. Newquist. Ph. Renaud. *Display Works*, 98, San Jose, Jan. 20–22, 1998.

* cited by examiner

*Primary Examiner*—John S. Chu
(74) *Attorney, Agent, or Firm*—Fay, Sharpe, Fagan, Minnich & McKee, LLP (57) ABSTRACT

A method for casting a thick layer of photoresist material onto a substrate. The method including the steps of pressing the photoresist against the substrate material using a presser plate and limiting the travel of the presser plate by using spaces which can be positioned on the substrate material. The process further including the step of holding the presser plate in a pressed position while the photoresist is at least partially cured or solidified.

28 Claims, 6 Drawing Sheets

METHOD OF CASTING PHOTORESIST ONTO SUBSTRATES

The present invention relates to the art of applying a photoresist onto a substrate and, more particularly to an improved method of casting a thick photoresist onto substrates such that the photoresist has a uniform thickness.

INCORPORATION BY REFERENCE

The present invention relates to casting substrates with a thick layer photoresist. Coating substrates with a photoresist is known in the art and is generally shown and described in Chun U.S. Pat. No. 6,191,053. This patent is incorporated by reference herein as background information illustrating photoresist material and coating photoresist on a substrate. Further, this patent illustrates the importance of minimizing the waste of the photoresist in view of the cost of this material.

BACKGROUND OF THE INVENTION

The present invention is particularly applicable for use in connection with applying a thick layer of photoresist for use in connection with a print head and, therefore, the invention will be described with particular reference to a thick photoresist layer used as a component of a print head. However, the invention has much broader applications and may be used in connection with many other products.

For example, the invention of this application is particularly useful in connection with products which can effectively use a photoresist if the photoresist can be applied in a thick and uniform manner. This can include x-ray conversion screens wherein an even top surface of a photo polymer is required because it must be brought into close contact with the surface of an image sensor array. Further, the photo polymer may be bonded to the image sensor array which necessitates a smooth uniform surface for good adhesion. Another application involves microfluidic circuits wherein the micro-channels or micro-reservoirs, which are patterned into the photoresist, are typically being sealed by bonding a cover plate, such as a glass plate, to the photoresist. Accordingly, an even surface on the photoresist layer is required. An uneven surface would require an excess amount of adhesive which would in turn clog the micro-channels or micro-cavities of the device. Even yet another potential application for the invention of this application relates to flat panel displays wherein a photoresist can be used as a space material in the flat panel displays such as plasma displays. A layer thickness of greater than 1 mm can be required which must have good uniformity. Uneven surface topography has to be avoided because a plate, such as a glass plate, is bonded to the photoresist in order to seal the display. Yet a further application for the invention of this application relates to applying a photoresist coating onto a substrate which has high topography such as in connection with micro-electro-mechanical systems (MEMS). The method according to the present invention will allow a smooth topography photoresist layer to be applied to the MEMS even though the substrate is uneven.

It is, of course, well known that a photoresist can be used in connection with a mask to produce a desired geometric shape on a substrate. In this respect, the geometric shape is transferred to a substrate utilizing a lithographic process. This process includes first applying a photoresist onto the substrate. In order to apply the photoresist, it must be in a liquid form which in prior art methods necessitated a solvent to be used in connection with the photoresist material. The solvent in the photoresist produces the necessary flow qualities and allows the photoresist to flow onto the substrate such that a relatively smooth topography is achieved. Next, the solvent must be evaporated from the photoresist material. While the solvent will naturally evaporate, heat is used to speed the process. Once a sufficient amount of solvent is removed, the photoresist solidifies upon cooling to room temperature. It should be noted that although most photoresists used in microelectronics contain solvents, photosensitive polymers exist which do not contain any solvents but which are in liquid form prior to light exposure (for example photosensitive adhesives from DYMAX corporation or standard resins used in stereolithography). The photoresist is a polymer that is radiation-sensitive thereby reacting to exposure to ultraviolet light, electron beams, x-rays or ion beams, for example. Accordingly, a mask is placed over the photoresist which corresponds to the desired geometric shape. The mask blocks the ultraviolet (UV) rays or light in the desired location so that the photoresist material is only selectively exposed. Once the mask is in place, the ultraviolet light is applied and subsequently, a solvent is used to wash away the undesired portions of the photoresist leaving the desired geometric shape on the substrate.

The mask used in the exposure process will depend on the desired geometric shape and whether the photoresist is a negative or a positive photoresist. In this respect, the mask used on a negative photoresist will be configured to allow the (UV) light to penetrate only the areas of the photoresist which are to remain after the process is complete. With this type of photoresist, the UV light will cause cross-linking in the photoresist. The portion of the photoresist which is not exposed to the UV light will not be cross-linked and, therefore, will be dissolved by the solvent applied after the exposure process. The opposite is true for positive photoresist materials. The mask will be configured to allow the UV light to penetrate only the portions of the photoresist which are to be dissolved away. It should be noted that the invention of this application can be practiced in connection with either positive or negative photoresists.

Prior art methods of applying a photoresist to a substrate have many problems associated with producing a uniform topography in the resulting photoresist layer. One of the problems is that uneven topography of the photoresist layer worsens as the thickness of the layer increases. As is shown in Chun U.S. Pat. No. 6,191,053, prior art methods used to apply a photoresist to a substrate include spinning the photoresist onto the substrate. The spinning process requires a solvent to be used in connection with the photoresist to produce the necessary flow from the ejector nozzle of the spinning device onto the substrate. Referring to FIG. 11 of Chun, the photoresist nozzle is spaced from the substrate and includes a passage for dispensing the photoresist. Once the photoresist exits the nozzle, it flows onto the substrate producing a thickness H which is less than the space between the nozzle and the substrate. While the spinning process can effectively apply a photoresist to a substrate, the thickness is a function of the flow characteristics of the photoresist and is difficult to control for thick resist layers. The spinning process can only produce an accurate thickness for thin layers. Therefore, several passes are necessary to produce a thick photoresist layer. The multiple passes disadvantageously increase the time necessary to coat the substrate and also produce a photoresist layer with an uneven topography. Furthermore, after each application, the edge bead of the photoresist may have to be removed which is an additional step and is wasteful of the expensive photoresist material. In order to produce a smooth topography, a costly polishing step is necessary which is also time-consuming.

For a high nozzle density (greater than 600 dpi resolution) printer it has been found that channel-shaped ink ejectors can be patterned using photolithography in connection with a thick layer of epoxy photoresist. The layer thickness involved is between 100 and 1,000 microns. However, the height of the channels must be very uniform over a large area since an attachment plate for the print head must be bonded to the top surfaces of the channels. Height variations in the channels require a thick glue layer for bonding and sealing the attachment plate to the photoresist channels. As can be appreciated, utilizing a thick glue layer could cause clogging of the channels. Furthermore, in order to obtain the thickness necessary to produce the channels, several thin layers would need to be produced using the spin coating method. After each layer, the edge bead would need to be removed. Again, as stated above, a polishing step would also need to be performed to produce the necessary uniform ink ejectors.

The uneven photoresist topography is not only a result of the prior art application methods, the prior art baking process can further impact uniformity of the photoresist if the hot plate is not perfectly level. This is the result of the photoresist flowing during the long soft bake process which can take several hours.

SUMMARY OF THE INVENTION

In accordance with the present invention, provided is a method of casting a thick layer photoresist onto a substrate to produce a uniform photoresist layer. In this respect, the method according to the present invention achieves a uniform thickness of a thick photoresist layer by positioning spacers between the substrate and a presser plate and pressing a flowable photoresist onto the substrate using the presser plate wherein the thickness of the photoresist layer is maintained by the size of the spacers. The photoresist is then cured or solidified while being pressed by the presser plate thereby producing a photoresist layer having a uniform thickness.

One aspect of the casting method according to the present invention, the spacers, having substantially uniform thicknesses, are positioned on the substrate and are spaced from an application surface on the substrate. A desired amount of photoresist is then applied to the application surface. The photoresist, which is above its melt temperature so that it will flow, is then pressed by a presser plate that is moved toward the substrate until it engages the spacers. The presser plate includes a flat uniform pressing surface corresponding to the application surface of the substrate thereby producing the desired topography in the photoresist layer. The presser plate is maintained in the pressed position as the photoresist is slowly cooled to below its melt temperature. Once the photoresist is adequately cured or solidified, the presser plate is released.

In accordance with another aspect of the present invention, the method of coating the substrate with the layer of cured or solidified photoresist such that the layer has the desired thickness includes the steps of providing the substrate which has at least one application surface to be coated with the layer of solidified photoresist; providing a presser plate having a pressing surface, the pressing surface being moveable toward the at least one application surface; providing at least one spacer between the presser plate and the substrate, each of the at least one spacer having a spacer thickness; dispensing a non-solid photoresist on the at least one application surface; moving the pressing surface toward the application surface into a pressing position wherein the at least one spacer has stopped the moving; and, at least partially solidifying the non-solidified photoresist when in the pressing condition.

In accordance with yet another aspect of the present invention, the method of applying the photoresist on the application surface of the substrate such that the photoresist has the desired thickness includes the steps of: applying a flowable photoresist on the substrate; moving the pressing plate having the pressing surface toward the substrate such that the pressing surface urges the flowable photoresist toward the substrate; and, at least one of the substrate and the pressing plate including at least one spacer, the at least one spacer limiting the moving such that the pressing surface stops the moving when the substrate is substantial at the desired thickness.

In accordance with even yet another aspect of the present invention, the method of coating the substrate with the photoresist includes the steps of moving the pressing plate toward the substrate after the photoresist has been applied to at least a portion of the substrate and controlling the movement toward the substrate with a plurality of spacers positioned between the pressing plate and the substrate.

In accordance with even yet another aspect of the present invention, a method of producing a print head having a plurality of ejector channels having a uniform thickness and extending between a base surface and an attachment plate includes the steps of: providing a substrate having the base surface; applying a flowable photoresist on the base surface of the substrate; moving a pressing plate having a pressing surface toward the substrate such that the pressing surface urges the flowable photoresist toward the substrate; at least one of the substrate and the pressing plate including at least one spacer, the at least one spacer having a spacer thickness and being between the presser plate and the substrate; the at least one spacer limiting the moving of the pressing plate when the pressing plate is in a pressing position; at least partially curing or solidifying the photoresist when in the pressing position; placing a mask over the photoresist corresponding to a desired configuration of the ejector channels; exposing the photoresist; and, securing the attachment plate to the ejector nozzles.

BRIEF DESCRIPTION OF THE DRAWINGS

The foregoing will in part be obvious and in part be pointed out more fully hereinafter in connection with a written description of preferred embodiments of the present invention illustrated in the accompanying drawings in which.

DESCRIPTION OF PREFERRED EMBODIMENTS

Figure 1:
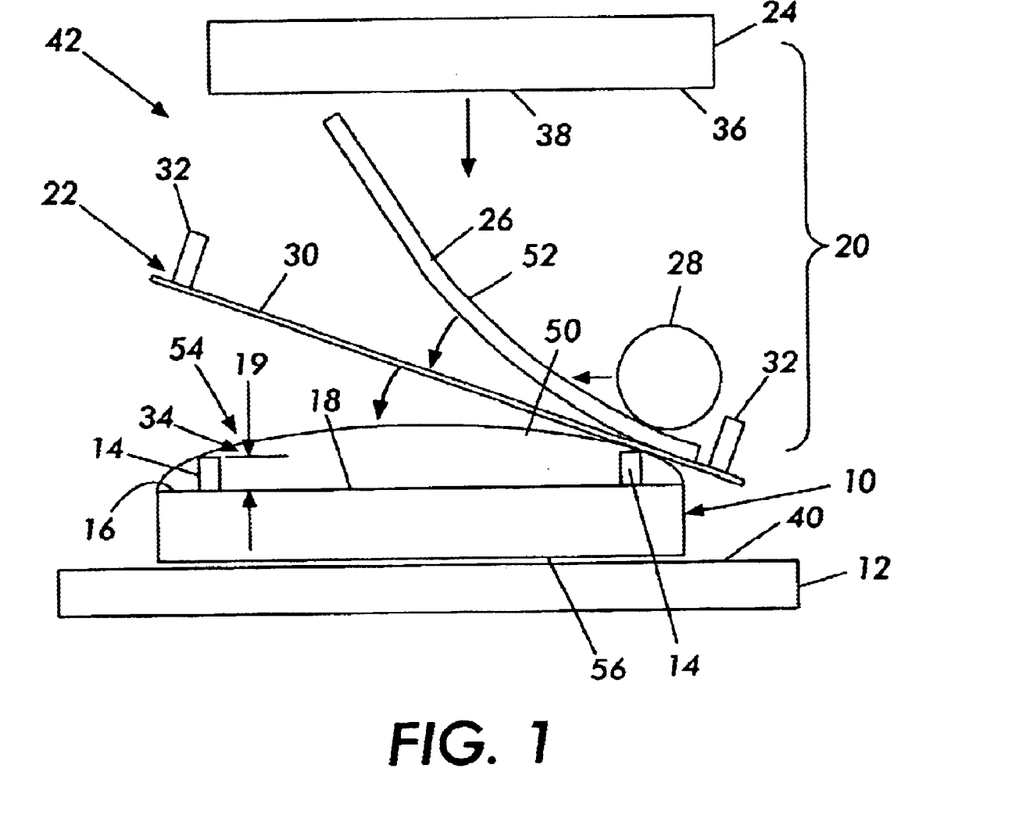
FIG. 1 is an elevational view of a substrate after a photoresist has been applied to an application surface and a presser plate which is shown in the open position.
Figure 2:
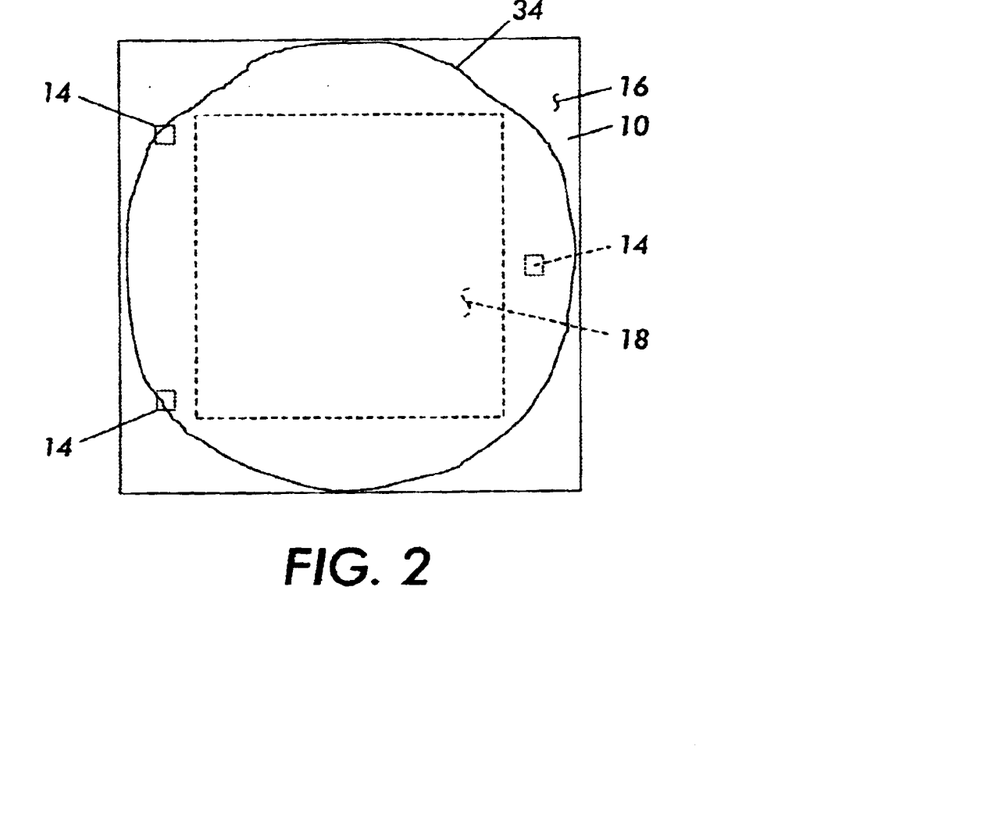
FIG. 2 is a top view of the substrate shown in FIG. 1.
Figure 3:
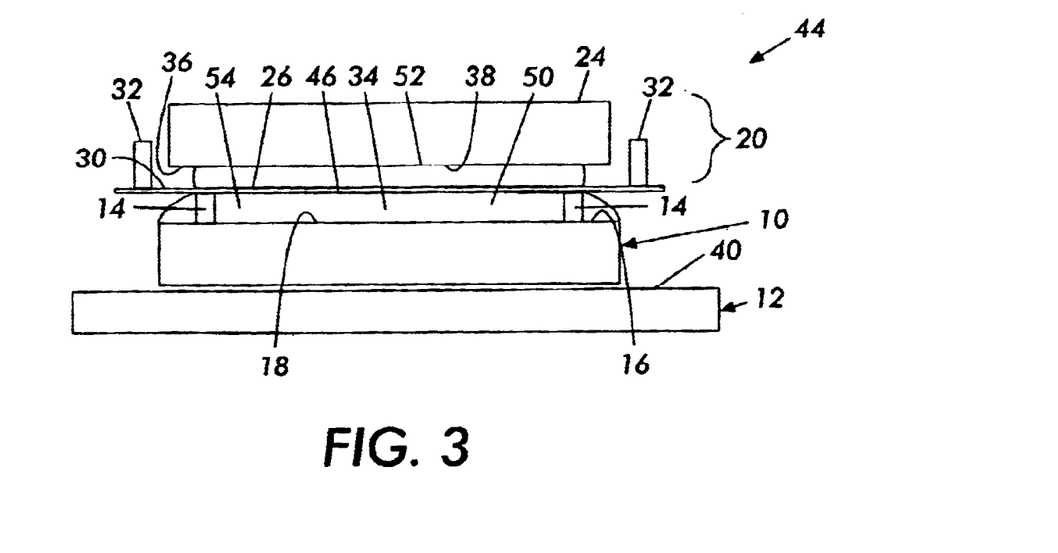
FIG. 3 is an elevational view of the photoresist being pressed onto the substrate wherein the presser plate is in the pressing position.

Referring now in greater detail to the drawings wherein the showings are for the purpose of illustrating preferred embodiments of the invention only, and not for the purpose of limiting the invention, referring to FIGS. 1–3, shown is a substrate 10 positioned on a hot plate 12. In this embodiment, spacers 14 are attached to substrate 10 on upwardly facing surface 16. Spacers 14 are positioned on either side of an application surface 18 which only covers a portion of substrate upward surface 16. Spacers 14 have a thickness or height 19 which corresponds with the desired thickness of the resulting photoresist layer. The resulting thickness, according to the present invention, can be up to 3 mm. While the disclosed process can cast thicker photoresist layers, complete exposure of photoresist layers greater than 3 mm is difficult with currently available photoresist.

Pressing plate 20 is a multi-component pressing plate having a flexible portion 22 and a flat rigid portion 24. Flexible portion 22 includes a flexible sheet 26 which can be made from flexible glass or other similar material, a roller 28 and a low adhesion film 30, which is preferably a stretched Mylar (polyester) film or a film of low-surface energy material such as the fluorocarbon polymers (e.g. Teflon) or Parylene films. Other materials for the film are possible and it depends on the chemistry of the photopolymer; the film or membrane 30 could also be made by taking various kinds of material that can be shaped into a smooth film and coating it with a material of low surface energy such as a fluorocarbon polymer. Film 30 can be suspended from hangers 32 allowing film 30 to be suspended above substrate 10 during the dispensing of photoresist 34. The interengagement between the flexible portion and the supporting tooling structure is not shown in that the actual attachment thereof is not part of this invention. Any suitable suspension device can be used to support film 30 above substrate 10 and also to move roller 28 across sheet 26. The function of these structures and other structures shown in FIGS. 1–3 will be discussed in greater detail below. Turning to rigid portions 24, it is also suspended above substrate 10 during the dispensing portion of this process. Again, the actual mechanism for suspending rigid portion 24 above substrate 10 is not shown in view of the fact that the specific connection with the surrounding tooling is not considered to be part of the invention of this application. Rigid portion 24 can also be a heated member and can be moved toward and away from substrate 10. Further, portion 24 includes a downwardly facing surface 36 having a pressing surface 38 aligned with application surface 18. Pressing surface 38 is configured according to the desired topography of the photoresist, the application surface 18 and spacers. In this respect, if substrate 10 is a substantially flat material and a uniform thickness of the photoresist is desired, pressing surface 38 can be calibrated to be substantially parallel to upward surface 40 of hot plate 12. However, as will be discussed in greater detail below, spacers are used to accurately align presser surface 38 relative to application surface 18 during pressing.

According to this embodiment of the present invention, spacers 14 are attached to or positioned on substrate 10. Alternatively, the spacers could also be attached or positioned on the base plate underneath the substrate 10 (this is not shown in FIG. 1). In this case, the substrate has to make good contact with the base plate and the thickness of the substrate has to be accurate in order to ensure a precise thickness of the final photopolymer layer. The thickness of the substrate would have to be compensated when choosing the desired spacer height. It is preferred that three spacers are used and the spacers are generally in an isosceles triangle orientation spaced from the application surface of the substrate. The reason for this configuration is that only three points are necessary to define a plane. A flat surface, which is able to rock, that is pressed against a three-point arrangement will engage all three points and will be substantially in the same orientation each time it is pressed into position. If a fourth spacer was used, minor manufacturing variances would likely cause the flat plate to only engage three of the four spacers even with advanced manufacturing techniques.

Turning to the method of casting a thick photoresist, substrate 10 is first positioned on hot plate 12 such that it is oriented below pressing plate 20 and pressing surface 38 is in alignment with application surface 18. Pick-and-place technology can be used to place the substrate onto plate 12. Once the substrate is in place, photoresist 34 is dispensed on application surface 18. As is shown in FIG. 1, some extra photoresist 34 is dispensed on the application surface to ensure that the pressing operation produces a flat topography. As can be seen, photoresist 34 extends above spacers 14 and outwardly of the application surface. Excess photoresist will be removed after the exposure process which will be discussed in greater detail below. While photoresist 34 must be viscous to allow it to be dispensed and pressed, high amounts of solvent are not necessary to produce the high flow properties previously necessary in processes such as spinning. All that is necessary is the photoresist is pliable and can be deposited on the substrate wherein its configuration can be altered by the pressing process.

While the specific photoresist composition is not a part of this invention, in general terms, many photoresists essentially include a resin and a photo initiator, there are photopolymers where the resin itself is intrinsically photosensitive (e.g. Syrian asphalt). Also, if the polymer is exposed with electrons, ions or X-rays, a photoinitiator may not be required because the energy is high enough to cause chemical changes in the resin (such as in polymethylmethacrylate). As stated above, the photoresist may also contain a solvent. The photo initiator can be a salt (such as triaryl sulfonium salt, but many other photosensitizers are available and the choice depends on the chemistry of the resin system) which when exposed to ultraviolet light starts the cross-linking of the photopolymer. Again, the process of this application is not to be limited to a particular type of photoresist. Further, the UV exposure of the photoresist and the subsequent washing steps will be discussed in greater detail below. However, it is preferred that a low-solvent photoresist is used since it reduces the time-consuming processing step to evaporate the solvent. Alternatively, a non-solvent photopolymer could be used which would eliminate the processing step to evaporate the solvent. One type of solvent-free polymers would require heating to soften the polymer by bringing it above its melting point. Another type, such as UV curable adhesive polymers from DYMAX, would stay liquid until they are exposed to UV light. This type of polymer does not require a heating step.

The photoresist is then heated for two reasons. First, if a solvent-based photoresist is used, heating the photoresist speeds up the removal or evaporation of any solvents within the photoresist. Second, heating softens the photoresist for the pressing step which will be discussed below. It is preferred that the photoresist is sufficiently soft that the pressing operation can easily deform the photoresist into the desired configuration without developing significant internal stresses. While the temperature used to speed up solvent removal and to soften the photoresist may be the same temperature, based on the solvents and the photoresist, different temperatures may be utilized to maximize each step in that each step has clearly different objectives. Furthermore, the temperature utilized to press the photoresist must be sufficient to allow it to be deformed, however, higher temperatures will produce higher shrinkage during the cooling step. Therefore, the temperature used to press in the photoresist should be only high enough to provide the needed pliability of the photoresist.

After the photoresist is dispensed onto the substrate and properly heated, it is pressed by pressing plate 20. More particularly, pressing plate 20 is moved from open position 42 which is shown in FIG. 1 to pressing position 44 which is shown in FIG. 3. As stated above, this embodiment utilizes a two-component pressing plate having a flexible and a rigid portion to minimize trapped air between pressing surface 38 and top surface 46. As can be imagined, an air bubble in top surface 46 will cause an uneven condition in the topography of the cured photoresist. However, other types of pressing plates can be utilized without detracting from the invention of this application. In this respect, a pressing plate can include only a rigid pressing portion 38 which remains substantially parallel to the application surface and/or rotates about a horizontal axis such that it engages one side of the application surface first and subsequently pivots about its axis to engage the entire top surface of the photoresist.

The two-component pressing plate shown in FIGS. 1 and 3 involves a multi-step pressing process. First, flexible portion 22 engages first side 50 of photoresist 34. Low adhesion film 30 is used to separate flexible sheet 26 from photoresist 34. Sheet 30 has a low adhesion to photoresist and therefore releases easily from the cured photoresist material. Furthermore, by stretching sheet 30, an ultra smooth top surface 46 is produced. Once flexible portion 22 engages first side 20, roller 28 rolls along top 52 of flexible portion 22. Roller 28 can be a long cylindrical roller which has a length greater than the length of application surface 18 so that its pressing action engages the entire application surface as it rolls from first side 50 to second side 54. However, it should be noted that roller 28 is not required to have a length greater than the length of application surface 18. This rolling action mates film 30 against photoresist 34 in such a way that air pockets are minimized. However, this step of the process is not intended to produce a flat or uniform topography on top surface 46. Once the rolling process is complete, rigid portion 24 is moved toward substrate 10 until surface 36 of pressing plate engaging top 52 of flexible sheet 26. Rigid portion 24 continues toward substrate 10 until downwardly facing surface 36 is stopped by spacers 14. In this particular embodiment, flexible portion 22 is sandwiched between spacers 14 and rigid plate 24. Nonetheless, due to the uniform thickness of flexible sheet 26, the photoresist is pressed flat and includes a uniform topography. In order to ensure that pressing surface 38 is parallel to application surface 18 when in the pressing position 44, rigid portion 24 can be a floating or rocking member which allows it to be automatically oriented by spacers 14. This can easily provide a method of automatically adjusting the relationship of the rigid member to the application surface due to any imperfections between the substrate and the hot plate. As can be appreciated, in a high volume manufacturing environment, the engagement between the substrate and the hot plate can be effected by debris resting on the hot plate and/or surface imperfections in either bottom surface 56 of substrate 10 or top surface 40 of hot plate 12. The automatically orienting pressing plate accounts for these and other imperfections.

Pressing surface 38 has a configuration corresponding with the desired configuration of top surface 46. As is shown, the desired topography of top surface 46 is a uniform plane and therefore, surface 38 is shown to be planar. However, surface 38 can have a curved configuration, a cupped configuration or any other desired configuration just so the configuration allows the pressing surface to release from the photoresist after it is cured or solidified.

Pressing plate 20 is then maintained in pressing position 44 while photoresist 34 is at least partially cured or solidified. In this respect, the temperature of the photoresist is maintained above its melt temperature after the pressing step to equalize stresses by minimizing stress gradients within the photoresist. This is especially true with thicker photoresist layers. After the photoresist has been maintained above the melt temperature to minimize stresses, it is then slowly cooled to below its melt temperature. The rate of cooling is approximately 200 degrees per hour, however, this may change based on the photoresist utilized. The cooling rate of the photoresist also depends on the thickness thereof. The thicker the photoresist, the slower the cooling. Holding or pressing time is between several minutes for thinner photoresist layers up to an hour for photoresist layers in the millimeter range. By slowly lowering the temperature of the photoresist, the buildup of internal stresses is minimized and the photoresist is prevented from cracking. Once the photoresist is sufficiently below its melt temperature, the pressing plate is removed.

The final part of the process involves traditional lithographic processing using a mask to transfer the desired geometric shape to the photoresist. In this respect, once the photoresist has adequately cured or solidified, a mask is positioned on top of surface 46 which corresponds with a desired geometric configuration. With respect to the manufacture of print heads, the mask correspond to the configuration of the ejector channels used in the print head. Once the mask is positioned over photoresist 48, UV light is applied wherein only certain portions of the photoresist are exposed to the UV light according to the geometry of the mask.

In another embodiment, the photomask pattern or mask is part of membrane 30. More particularly, sheet 30 can include an opaque material such as a layer of aluminum or chrome which includes the desired geometric configuration.

Alternatively, flexible sheet 26 or even plate 24 can include the photomask pattern. In this case, materials transparent to light such as glass would have to be chosen for the sheet 26 or plate 24. If the mask is on sheet 26, then the plate 24 does not have to be transparent, but it must be removed before the exposure process.

After UV exposure, depending on the photoresist, the substrate is again heated so that the portions of the photoresist exposed to the UV lights become cross-linked. The photoresist is then washed or developed using a solvent so that the undesired portions of the photoresist are washed away leaving the desired geometric configuration consisting of the cross-linked photoresist. While this description relates to negative photoresist, the process can also be used effectively with positive photoresist.

Figure 8:
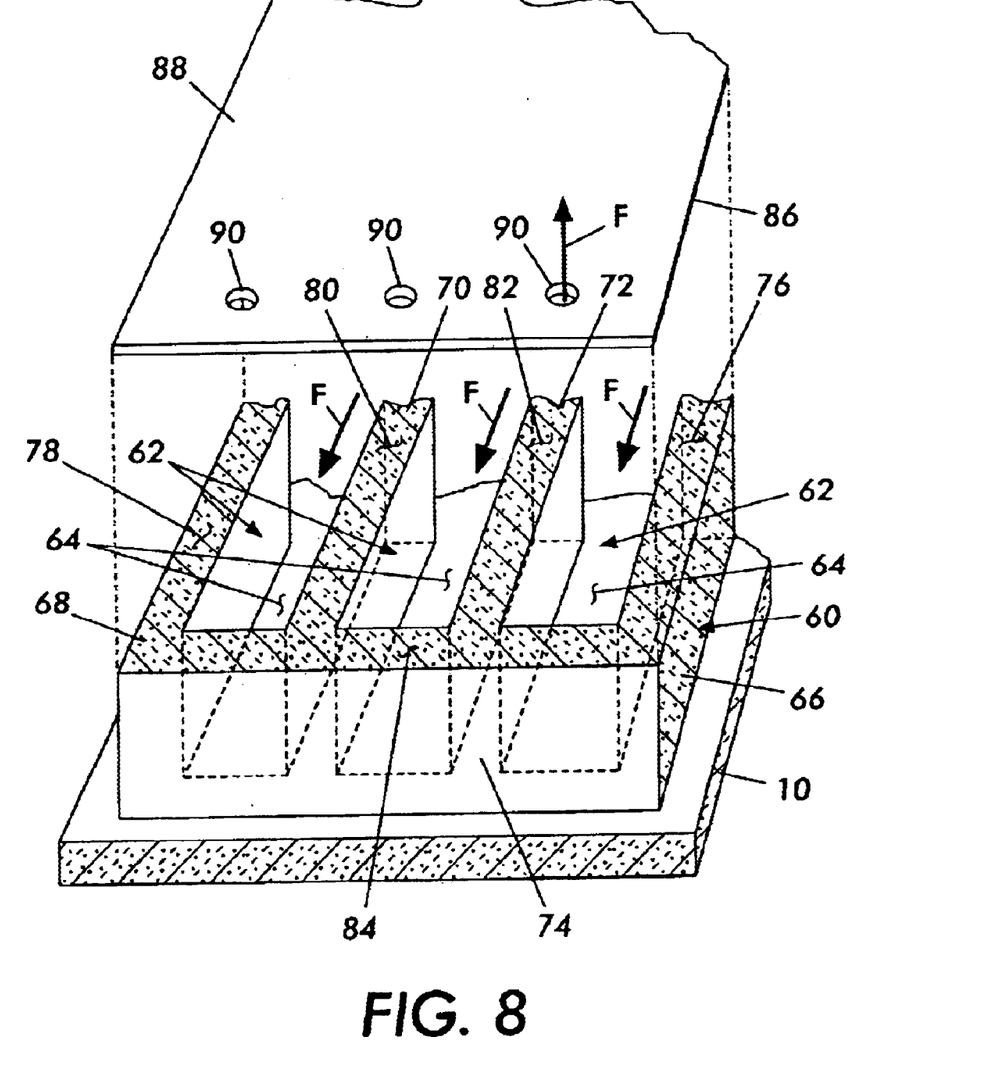

Referring to FIG. 8, the washed photoresist is now ready for subsequent processing according to the desired use of the component. In the case of use in connection with a print head, substrate 10 is a component of the print head. Cured or solidified photoresist 60 is configured as a plurality of ink ejector channels 62 having corresponding bases 64 which are portions of application surface 18 of substrate 10. Channels 62 extend along substrate 10 and are defined by outer channels walls 66 and 68, inner channel walls 70 and 72 and a channel end wall 74. The end wall opposite to end wall 74 is not shown. Each channel wall 66, 68, 70, 72, and 74 has a top surface 76, 78, 80, 82, and 84, respectively, which is to be secured to a bottom surface 86 of an attachment plate 88 by an adhesive (not shown). The adhesive is applied to either channel surfaces 76, 78, 80, 82 and 84 or bottom surface 86 and then attachment plate 82 is adhered to ink ejector channels 62. It is important that only a minimal amount of the adhesive is used to bond the attachment plate to the ink ejector channels so that the occurrence of clogged channels, due to misdirected adhesive, is minimized. The amount of the adhesive necessary to produce an acceptable bond between channels 62 and attachment plate 88 is a function of the uniformity of channel surfaces 76, 78, 80, 82 and 84 relative to one another. Channels 62 processed according to the present invention produce top surfaces 76, 78, 80, 82 and 84 which are equally spaced from substrate 10 and which are in a common plane thereby minimizing the amount of the adhesive necessary for the bond between surfaces 76, 78, 80, 82 and 84 and attachment plate surface 86. In use, ink F flows through the channels and out plate holes 90.

Figure 4:
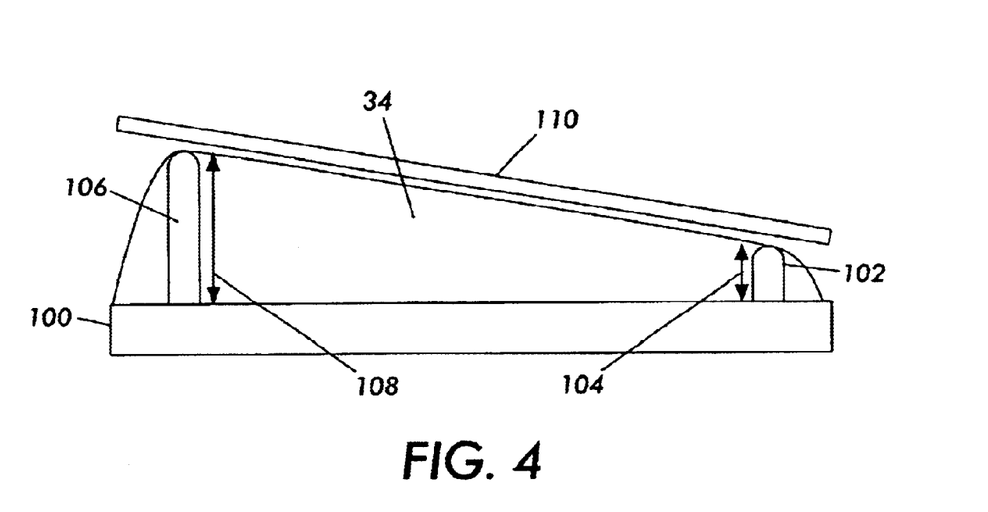
FIG. 4 is an elevational view of a substrate after a photoresist has been applied thereto wherein the spacers are of different heights.
Figure 7:
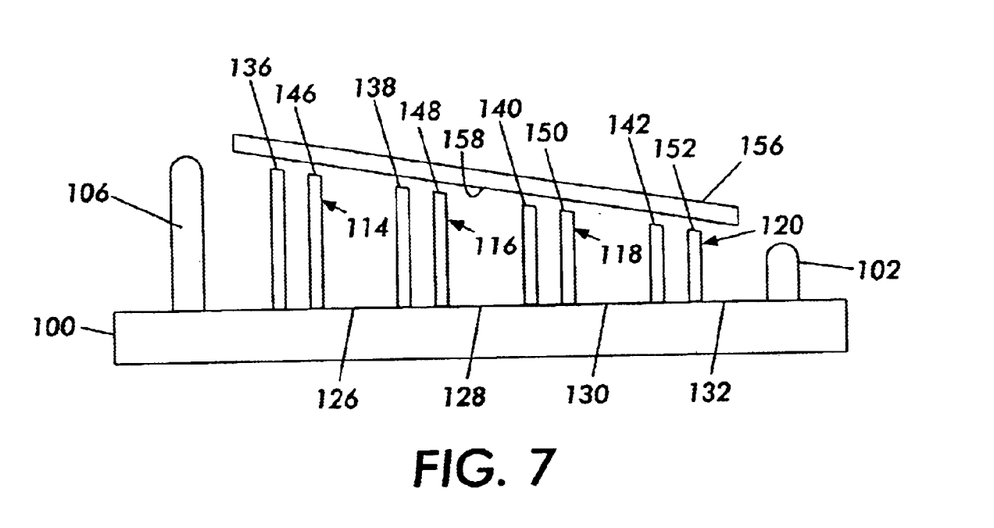
FIG. 7 is a sectional view of a substrate with exposed photoresist of a geometric shape having a varying height; and, FIG. 8 is an exploded perspective view of a photoresist in the form of ink channels and an attachment plate for a print head.

Referring to FIGS. 4 and 7, differently sized spaces can be used to produce a photoresist layer having a varying thickness. In this respect, shown is substrate 100 having spacers 102 having a first height 104 and spacers 106 having a second height 108. Height 104 is not equal height 108. As a result, when presser plate 110 is brought against spacers 102 and 106, the spacers force plate 110 into an angle relationship with substrate 100. In this embodiment, presser plate 100 is shown to be a single component design. However, a low surface energy material such as sheet 30 discussed above can still be used in connection with presser plate 110 to provide for sufficient release from the photoresist. While presser plate 110 can be calibrated to be essentially at the desired angle, it can also be connected to an actuating mechanism (not shown) to provide sufficient rocking action to allow the spacers to automatically adjust the plate to the desired angle. No matter which method is used, a certain amount of rocking action should be provided to ensure that the spacers control the alignment of the pressure plate relative to the application surface of the substrate. Once cured or solidified, the photoresist is masked, exposed and washed as discussed above, to produce ink ejector channels 114, 116, 118, and 120 which are spaced from one another. Channels 114, 116, 118, and 120 have different heights, a base end 126, 128, 130, and 132 and a top end 136, 138, 140, and 142, respectively. While the depth of each channel 114, 116, 118, and 120 is different, end surfaces 146, 148, 150, and 152 are still in a common plane and therefore can be easily adhesively bonded to attachment plate 156 bottom surface 158. This channel configuration is useful in testing new print head designs to determine the optimal channel depth.

As can be seen in a comparison between FIGS. 7 and 8, the resulting component shown in FIG. 7 has spacers 102 and 108 that are permanently attached to substrate 100 and which are not subsequently removed in a substrate trimming process. Furthermore, the spacers can be only temporarily connected to the substrate material. In this respect, there are many variations that can be used with respect to the spacers without deviating from the invention of this application. The spacers can be permanently attached to the substrate material wherein in a subsequent operation, the substrate is trimmed such that the portion of the substrate including the spacers is removed. In another embodiment, the spacers can be permanently attached to the substrate away from the application surface and can remain part of the substrate. Another option is the use of temporary spacers. This type of spacer is positioned on the substrate and then removed after the pressing operation. The removable spacer can be reused. As will be discussed with respect to yet another embodiment below, spacers can be incorporated into a dummy plate which also can be reused.

The spacers can be made from a wide variety of materials just so the material is capable of withstanding the heat involved in the process and maintaining its dimensional accuracy. Spacers which have been found to work well in this process include sapphire balls which are very precise. In addition, micromachined blocks such as etched, silicon blocks or polymer blocks made with photolithography can be used for spacers. Other methods and materials of making accurate spacers are possible.

Figure 5:
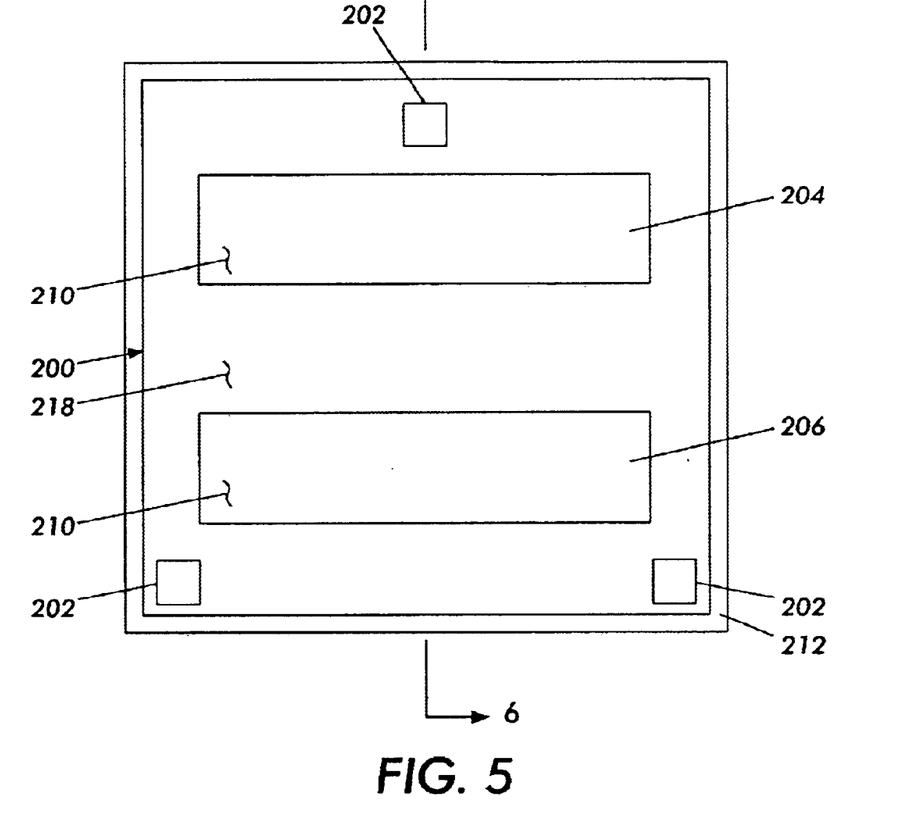
FIG. 5 is a top view of a substrate with a two-hole dummy plate positioned thereon.
Figure 6:
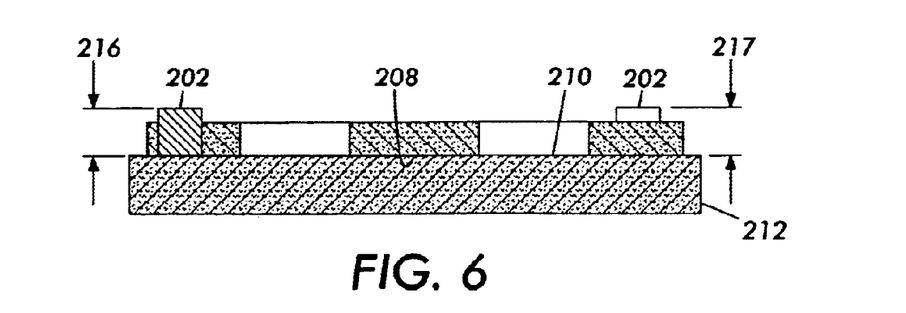
FIG. 6 is a sectional view taken along line 6—6 in FIG. 5.

Referring to FIGS. 5 and 6, shown is a two-hole dummy plate 200 which can be used in connection with the process of this invention. Dummy plate 200 includes spacers 202 and openings 204 and 206. Dummy plate 200 includes a bottom surface 208, machined to matingly engage with top surface 210 of substrate 212. It is preferred that spacers 202 are permanently attached to dummy plate 200 whereby this assembly can be easily reused. The dummy plate is positioned on the substrate before the photoresist is dispensed. The photoresist is then dispensed into opening 204 and 206. It should be noted that even though two openings are shown, any number of openings can be used in connection with dummy plate 200 without departing from the invention of this application. By using dummy plate 200 with openings 204 and 206, lateral support for photoresist is provided. The lateral support allows the amount of dispensed photoresist to be minimized in that the photoresist is prevented from flowing outwardly of the application surfaces. As will be appreciated, the photoresist must be sufficiently pliable or flowable to be dispensed and also to be pressed. Therefore, the photoresist will tend to flow outwardly of the dispensed zone especially during the pressing process unless the outward flow is restricted. By utilizing a dummy plate, the photoresist can be contained relative to the desired application surfaces. It is preferred that openings 204 and 206 are slightly larger than the corresponding application surfaces to ensure that the entire surface is coated by the photoresist. In order to provide for the excess photoresist dispensed, dummy plates 200 have a thickness 216 which is less than the thickness 217 of spacers 202. This provides a slight gap between the presser plates, not shown, and top surface 218 to allow for flow space for the excess photoresist. The gap also ensures that the spacers control the motion of the presser plate. As can be appreciated, the amounts of edge removal is minimized by utilizing dummy plate 200 in the process of this invention. Nonetheless, some edge removal may be still necessary with the dummy plate which can be handled during the masking and washing process as discussed above. Dummy plate 200 can be produced by machining and/or laser cutting a metal block or a polymer sheet (e.g. a poliimide plate) to produce openings 204 and 206, the outer perimeter and the desired thickness.

Another benefit of dummy plates is that they make the handling and positioning of the spacers easier. In this respect, it is more practical to have 500 micron sapphire spheres embedded in a dummy plate which can be handled easily as opposed to positioning the 500 micron spheres individually. The dummy plate also prevents the spacers from being displaced by the flowing photoresist without having to glue the spacers to the substrate. As with the substrate, pick-and-place technology can also be used to position the dummy plate relative to the substrate in order to allow semi-automation or full automation of the method of this application.

It is preferred that spacers 202 be permanently attached to the dummy plate which can be done using adhesive or a press fit between the spacers and the corresponding hole in dummy plate 200. If dummy plates 200 are to be reused, only a few need to be produced to provide for the manufacture of many substrate assemblies.

In yet another embodiment of the present invention, spacers can be attached to the substrate and the dummy plate can include openings to allow the spacers to penetrate through the dummy plate and engage the pressing plate during the pressing step of the process.

In even yet another embodiment, the photoresist is a photopolymer which is not solvent-based such as many UV-curable glues (e.g. DYMAX UV adhesives). In this embodiment, the polymer cannot be solidified by evaporating the solvent. In this case, plate 24, 26 or membrane 30 acts as a photomask. The photopolymer is then exposed through this mask while in the pressing position. The exposed areas will solidify or cross-link and the unexposed areas are then dissolved.

While considerable emphasis has been placed, on the preferred embodiments of the invention illustrated and described herein, it will be appreciated that other embodiments can be made and that many changes can be made in the preferred embodiments without departing from the principles of the invention. Accordingly, it is to be distinctly understood that the foregoing descriptive matter is to be interpreted merely as illustrative of the invention and not as a limitation.

Having thus described the invention, it is so claimed:

1. A method of coating a substrate with a layer of solidified photoresist such that said solidified layer has a desired thickness, said method including the steps of:
   providing the substrate having at least one application surface to be coated with said layer of solidified photoresist;
   providing a presser plate having a pressing surface, said pressing surface being moveable toward said at least one application surface;
   providing at least one spacer between said presser plate and said substrate, each of said at least one spacer having a spacer thickness;
   dispensing a flowable photoresist on said at least one application surface;
   moving said pressing surface toward said application surface into a pressing position wherein said at least one spacer has stopped said moving; and,
   at least partially solidifying said flowable photoresist when in said pressing condition.

2. The method according to claim 1, wherein said at least one spacer is three spacers.

3. The method according to claim 2, wherein said spacers are attached to said substrate about said application surface.

4. The method according to claim 2, wherein said spacers are positionable on said substrate about said application surface.

5. The method according to claim 1, wherein said at least one spacer is attached to said substrate.

6. The method according to claim 1, wherein said at least one spacer is positionable on said substrate.

7. The method according to claim 1, wherein said pressing surface rotates about an axis during said moving.

8. The method according to claim 1, wherein said pressing surface urges said non-cured photoresist toward said substrate and a non-stick material separates said pressing surface from said non-cured photoresist.

9. The method according to claim 1, wherein said at least one spacer includes a first and a second spacer, said first spacer having a different height than said second spacer.

10. The method according to claim 1, further including the step of positioning a dummy plate over said substrate, said dummy plate including at least one opening over said at least one application surface, respectively, said non-cured photoresist being dispensed into said at least one opening.

11. The method according to claim 1, wherein said presser plate includes a flexible portion and a rigid portion, and said at least one application surface having a first and a second side, said pressing step including first rolling said flexible portion from said first to said second side and then pressing said rigid portion against said flexible portion.

12. The method according to claim 1, further including the step of holding said pressing surface in said pressing position while slowly cooling said non-cured photoresist.

13. The method according to claim 1, wherein said non-cured photoresist is a low-solvent photoresist and said method further includes the steps of bringing the non-cured photoresist above its melt temperature before said dispensing and maintaining said non-cured photoresist in said pressing position while maintaining said photoresist above said melt temperature.

14. The method according to claim 13, further including the step of slowly cooling said non-cured photoresist while in said pressing position.

15. The method according to claim 1, further including the step of attaching said at least one spacer to said substrate.

16. The method according to claim 1, wherein said desired thickness of said cured layer is greater than 500 microns.

17. The method according to claim 1, wherein said desired thickness of said cured layer is between 1 mm and 3 mm.

18. The method according to claim 13 wherein said presser plate includes a mask corresponding with a desired configuration in the solidified photoresist.

19. The method according to claim 1, wherein said presser plate includes a low adhesion film separating said pressing surface from the photoresist.

20. The method according to claim 19, wherein one of said presser plate and said low adhesive film includes a mask corresponding with a desired configuration in the solidified photoresist.

21. A method of applying a photoresist on an application surface of a substrate such that said photoresist has a desired thickness, said method including the steps of:
   applying a flowable photoresist on said substrate;
   moving a pressing plate having a pressing surface toward said substrate such that said pressing surface urges said flowable photoresist toward said substrate; and,
   at least one of said substrate and said pressing plate including at least one spacer said at least one spacer limiting said moving such that said pressing surface stops said moving when said substrate is substantial at said desired thickness.

22. A method of coating a substrate with a photoresist including the steps of moving a pressing plate toward said substrate after said photoresist has been applied to at least a portion of said substrate, controlling said movement toward said substrate with a plurality of spacers positioned between said pressing plate and said substrate and at least partially curing said photoresist.

23. A method of producing a photoresist assembly having a plurality of appendages having a uniform thickness and extending between a base surface and a top surface which is joined to an attachment plate, said method including the steps of:

provding a substrate having said base surface;

applying a flowable photoresist on said base surface of said substrate;

moving a pressing plate having a pressing surface toward said substrate such that said pressing surface urges said flowable photoresist toward said substrate;

at least one of said substrate and said pressing plate including at least one spacer, said at least one spacer having a spacer thickness and being between said presser plate and said substrate;

said at least one spacer limiting said moving of said pressing plate when said pressing plate is in a pressing position;

at least partially solidifying said photoresist when in said pressing position;

placing a mask over said photoresist corresponding to a desired configuration of said appendages;

exposing said photoresist; and, securing said attachment plate to said top surface of said appendages.

24. The method according to claim 1, further including the step of placing a mask over said photoresist, said mask corresponding to a desired configuration in the solidified photoresist.

25. The method according to claim 24, further including the step of exposing said photoresist.

26. The method according to claim 25, wherein said exposing step is after said placing said mask step.

27. The method according to claim 25, further including the step of securing a plate to the solidified photoresist.

28. The method according to claim 20, further including the step of exposing said photoresist.

\* \* \* \* \*